United States Patent
Hiramoto et al.

(10) Patent No.: US 6,674,326 B1
(45) Date of Patent: Jan. 6, 2004

(54) DIGITALLY CONTROLLABLE NONLINEAR PRE-EQUALIZER

(75) Inventors: Remy O. Hiramoto, Hermosa Beach, CA (US); Susan E. Bach, Redondo Beach, CA (US); Suzanne E. Kubasek, El Segundo, CA (US); Thomas Cooper, Torrance, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/174,423

(22) Filed: Jun. 17, 2002

(51) Int. Cl.[7] .............. H03F 1/26; H03F 3/04; H04L 25/49
(52) U.S. Cl. ............. 330/149; 330/304; 375/297
(58) Field of Search ................. 330/149, 304; 375/297

(56) References Cited

U.S. PATENT DOCUMENTS

| 5,193,223 A | * | 3/1993 | Walczak et al. ......... 455/115.1 |
| 6,211,734 B1 | * | 4/2001 | Ahn ...................... 330/149 |
| 6,285,412 B1 | | 9/2001 | Twitchell |
| 6,342,810 B1 | | 1/2002 | Wright et al. |
| 6,519,374 B1 | * | 2/2003 | Stook et al. ................ 385/2 |

OTHER PUBLICATIONS

US 2002/0048326 A1 of Sahlman, Apr. 25, 2002, "Method and Apparatus for Plurality signal Generation".*

* cited by examiner

Primary Examiner—Patricia Nguyen
(74) Attorney, Agent, or Firm—DiPinto & Shimokaji, P.C.

(57) ABSTRACT

A digitally controllable nonlinear pre-equalizer system receiving an input signal and generating an output signal, the system including a splitter for dividing the input signal into a first signal path and a second signal path, an attenuator and a time delay element in the first signal path, the attenuator and the time delay element operable to generate a linear signal, a mixer and a vector modulator in the second signal path, the mixer being responsive to a signal from a digital to analog converter coupled to a processor chip providing a digital signal to the digital to analog converter, the mixer and vector modulator operable to generate a nonlinear signal, and a summer for summing the linear signal and the nonlinear signal to generate the output signal.

18 Claims, 6 Drawing Sheets

| TUBE # | CURRENT VALUE | DIGITAL WORD |
|---|---|---|
| TWTA 1 | 4.5 mA | 000010111000 |
| TWTA 2 | 4.0 mA | 000100111001 |
| TWTA 3 | 3.5 mA | 001000111010 |
| TWTA 4 | 3.0 mA | 010000111100 |
| TWTA 5 | 2.5 mA | 100000111011 |
| TWTA 6 | 2.0 mA | 100001111101 |

DIGITALLY CONTROLLABLE NONLINEAR PRE-EQUALIZER

BACKGROUND OF THE INVENTION

Figure 1:
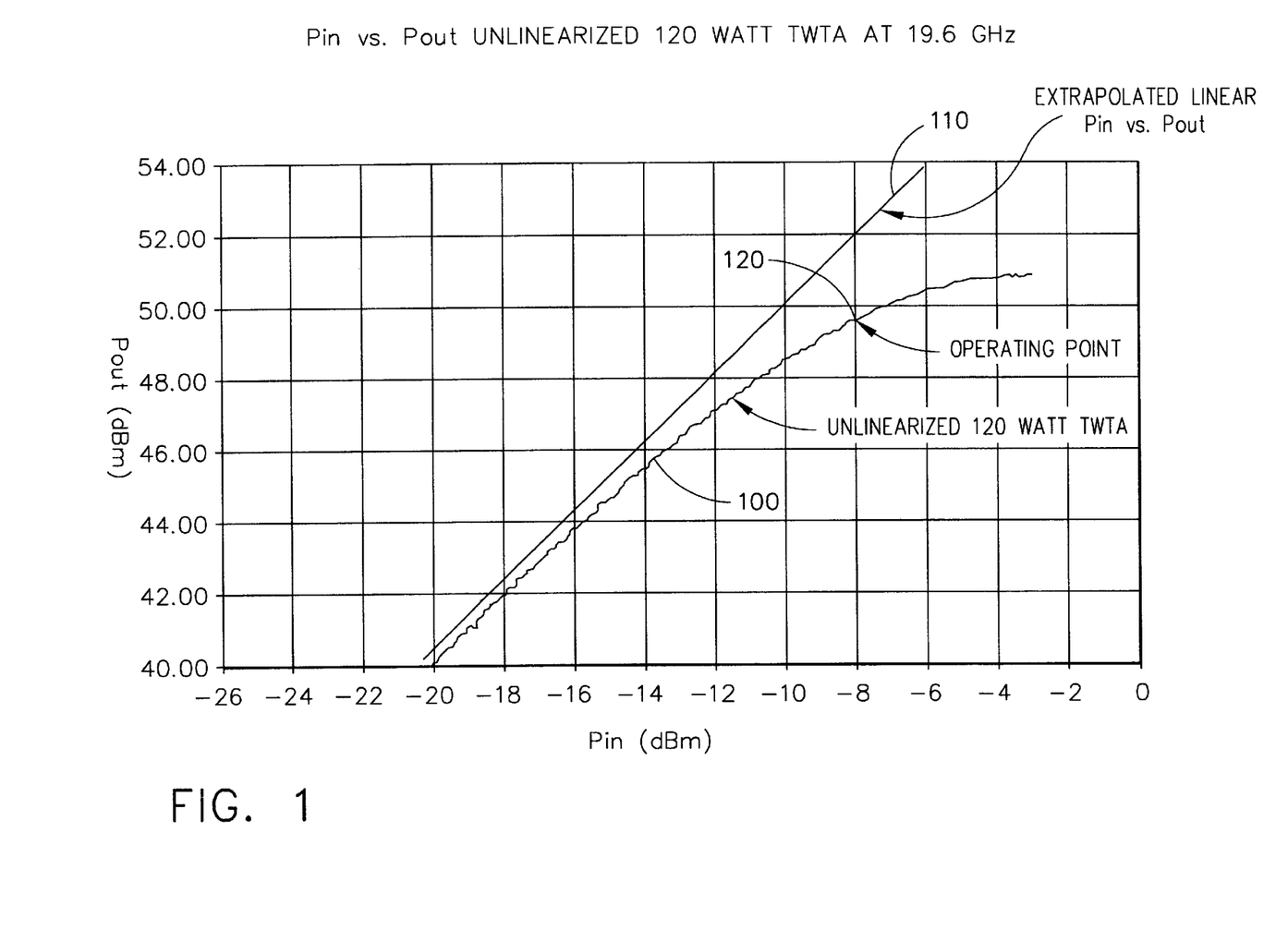
FIG. 1 is a graphical representation of a transfer characteristic of a power amplifier.

The present invention generally relates to power amplifiers and, more particularly, to a digitally controllable pre-distortion system and method for compensating for nonlinearities within the power amplifier A typical power amplifier, such as a traveling wave tube amplifier (TWTA), exhibits a nonlinear characteristic 100 as illustrated in FIG. 1. A linear region is defined as the range up to the point where increasing the RF input signal results in gain compression. The input power versus output power characteristic shown, also known as, amplitude to amplitude modulation (AM/AM) curve, rolls off from the linear region as the input power increases and the output power reaches saturation. This effectively means that the amplifier gain decreases in the nonlinear region while the efficiency of the amplifier is at a maximum.

In addition gain compression effects, typical power amplifiers also exhibit nonlinear amplitude to phase modulation (AM/PM) effects (not shown). When using higher order modulation schemes with multi-amplitude symbols, additional unintentional phase modulation occurs when operating in the nonlinear region.

Typically, the power amplifier is operated at an operating point 120 which is "backed off" from its maximum output capacity in order to maintain linearity. Even though the power amplifier is operating in the "backed off" linear region, the amplifier still consumes power and has a low input power to output power conversion efficiency.

A known method to compensate for amplifier nonlinearities includes predistortion techniques. A nonlinear pre-equalizer is tuned for a particular amplifier and predistorts an input signal to the amplifier to compensate for the distortion that occurs to the signal after going through a TWTA with certain AM/AM characteristics. The predistorted input signal typically experiences a desired gain expansion with input power so that the combined effect is linear gain up to saturation. By this method an extrapolated transfer characteristic 110 is approached.

This approach suffers from the disadvantage of being amplifier specific, that is, each amplifier requires a specifically tuned nonlinear pre-equalizer. As is well known in the art, this is costly in terms of both hardware and manufacturing time expended in tuning each nonlinear pre-equalizer. More particularly, in satellite applications, payloads are increased by the requirement that each TWTA have it's own nonlinear pre-equalizer.

A known predistortion system is disclosed in U.S. Pat. No. 6,342,810 to Wright et al. The system includes a data structure in which each element stores a set of compensation parameters including finite impulse response (FIR) filter coefficients for predistorting a wideband input transmission signal. The parameter sets are preferably indexed within the data structure according to multiple signal characteristics, such as instantaneous amplitude and integrated signal envelope, each of which corresponds to a respective dimension of the data structure. To predistort the input transmission signal, an addressing circuit digitally generates a set of data structure indices from the input transmission signal, and the indexed set of compensation parameters is loaded into a compensation circuit which digitally predistorts the input transmission signal. The process of loading new compensation parameters into the compensation circuit is preferably repeated every sample instant, so that the predistortion function varies from sample to sample. The sets of compensation parameters are generated periodically and written to the data structure by an adaptive processing component that performs a non-real time analysis of amplifier input and output signals. The system includes a digital compensation signal processor, a generalized digital to analog converter, an RF upconversion block coupled to a nonlinear amplifier, an amplifier sampling structure, an RF downconversion block, a generalized analog to digital converter, and an adaptive control processing and compensation estimator.

As can be seen, there is a need for a digitally controllable system and method for compensating for nonlinearities within a power amplifier. The described system is adaptable to a plurality of power amplifiers. Further, the described system is easy to implement, and reduces implementation cost of the system by eliminating the need for a separate linearizer for each traveling wave tube amplifier.

SUMMARY OF THE INVENTION

In one aspect of the present invention, a digitally controllable nonlinear pre-equalizer circuit for receiving an input signal and generating an output signal includes a splitter for dividing the input signal into a first signal path and a second signal path; an attenuator and a time delay element in the first signal path, the attenuator and the time delay element operable to generate a linear signal; a mixer and a vector modulator in the second signal path, the mixer being responsive to a signal from a digital to analog converter coupled to a processor chip providing a digital signal to the digital to analog converter, the mixer and vector modulator operable to generate a nonlinear signal; and a summer for summing the linear signal and the nonlinear signal to generate the output signal.

In another aspect of the present invention, a digitally controllable nonlinear pre-equalizer circuit for receiving an input signal and generating an output signal includes a splitter for dividing the input signal into a first signal path and a second signal path; an attenuator and a time delay element in the first signal path, the attenuator and the time delay element operable to generate a linear signal; a mixer and a vector modulator in the second signal path, the mixer being responsive to a signal from a digital to analog converter coupled to a processor chip providing a digital signal to the digital to analog converter, the processor chip being operable to store a plurality of power amplifier parameters corresponding to a plurality of power amplifiers, each power amplifier parameter being provideable as the digital signal, the mixer and vector modulator operable to generate a nonlinear signal; and a summer for summing the linear signal and the nonlinear signal to generate the output signal.

In yet another aspect of the present invention, an amplifier system for receiving an input signal and generating an output signal includes a power amplifier; a splitter for dividing the input signal into a first signal path and a second signal path; an attenuator and a time delay element in the first signal path, the attenuator and the time delay element operable to generate a linear signal; a mixer and a vector modulator in the second signal path, the mixer being responsive to a signal from a digital to analog converter coupled to a processor chip providing a digital signal to the digital to analog converter, the mixer and vector modulator operable to generate a nonlinear signal; and a summer for summing the linear signal and the nonlinear signal to generate a gain expansion signal, the gain expansion signal being input to the power amplifier, the power amplifier providing the output signal.

In a further aspect of the present invention, a method of digitally controlling a nonlinear pre-equalizer circuit receiving an input signal and generating an output signal includes dividing the input signal into a first signal path and a second signal path; providing an attenuator and a time delay element in the first signal path, the attenuator and the time delay element operable to generate a linear signal; providing a digital to analog converter coupled to a processor chip; providing a mixer and a vector modulator in the second signal path, the mixer being responsive to a signal from the digital to analog converter, the processor chip providing a digital signal to the digital to analog converter, the mixer and vector modulator operable to generate a nonlinear signal; and summing the linear signal and the nonlinear signal to generate the output signal.

In yet another aspect of the present invention, a satellite system for receiving an input signal and generating an output signal includes a satellite; a power amplifier disposed on said satellite; a nonlinear pre-equalizer circuit coupled to said power amplifier, said nonlinear pre-equalizer circuit including a splitter for dividing the input signal into a first signal path and a second signal path; an attenuator and a time delay element in the first signal path, the attenuator and the time delay element operable to generate a linear signal; a mixer and a vector modulator in the second signal path, the mixer being responsive to a signal from a digital to analog converter coupled to a processor chip providing a digital signal to the digital to analog converter, the mixer and vector modulator operable to generate a nonlinear signal; and a summer for summing the linear signal and the nonlinear signal to generate a gain expansion signal, the gain expansion signal being input to the power amplifier, the power amplifier providing the output signal.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention generally provides a digitally controllable predistortion system and method for compensating for nonlinearities within a power amplifier. The system and method of the invention provide for optimized power usage and channel performance of power amplifiers, and more particularly, traveling wave tube amplifiers (TWTA) deployed aboard satellites. A circuit of the invention is inexpensive and is adaptable to a plurality of TWTAs.

Figure 2:
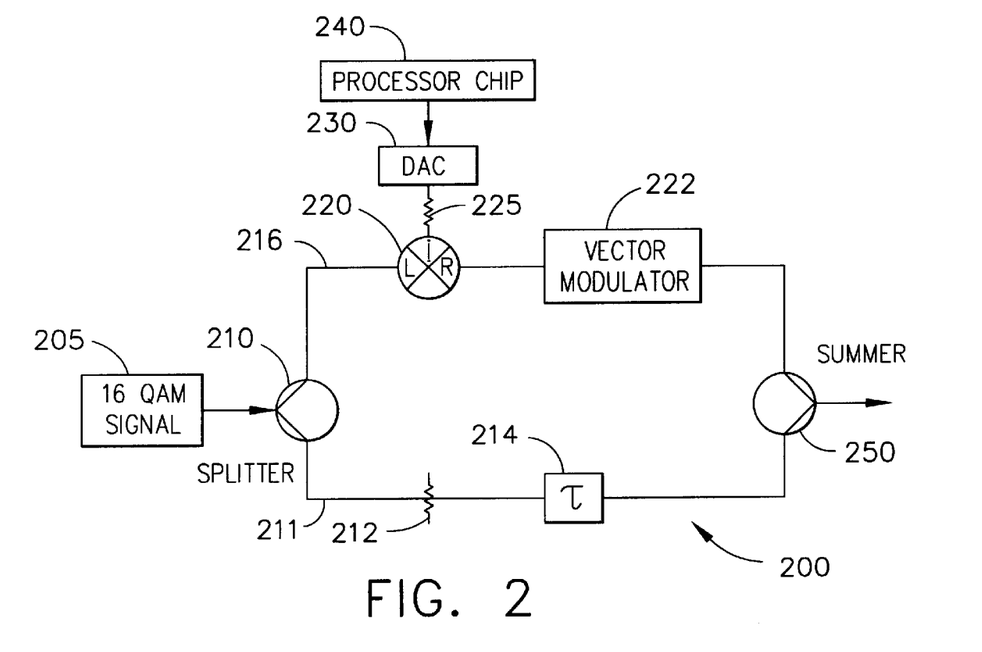
FIG. 2 is a circuit diagram in accordance with the invention.

In one embodiment, a digitally controllable nonlinear pre-equalizer circuit generally designated 200 may include a splitter 210, an attenuator 212, a delay element 214, a mixer 220, a vector modulator 222, a digital to analog converter (DAC) 230, a processor chip 240, and a summer 250 as illustrated in FIG. 2. In operation, an input signal 205 may be divided into two signal paths by splitter 210. A first signal path 211 may be linear with some attenuation introduced by attenuator 212 and some delay introduced by delay element 214 to match a second signal path 216. The second signal path 216 may be nonlinear as compressed by mixer 220 and adjusted by vector modulator 222. Parameters specific to each power amplifier are stored in processor chip 240 and input to DAC 230 which, in turn, provides a current to mixer 220 through resistor 225. The first and second signal paths 211 and 216 may then be summed by summer 250 and output to the power amplifier (not shown). In this manner, the digitally controllable nonlinear pre-equalizer circuit of the invention is adaptable to a plurality of power amplifiers without the need for signal sampling and application specific integrated circuits as known in the prior art.

Figure 3:
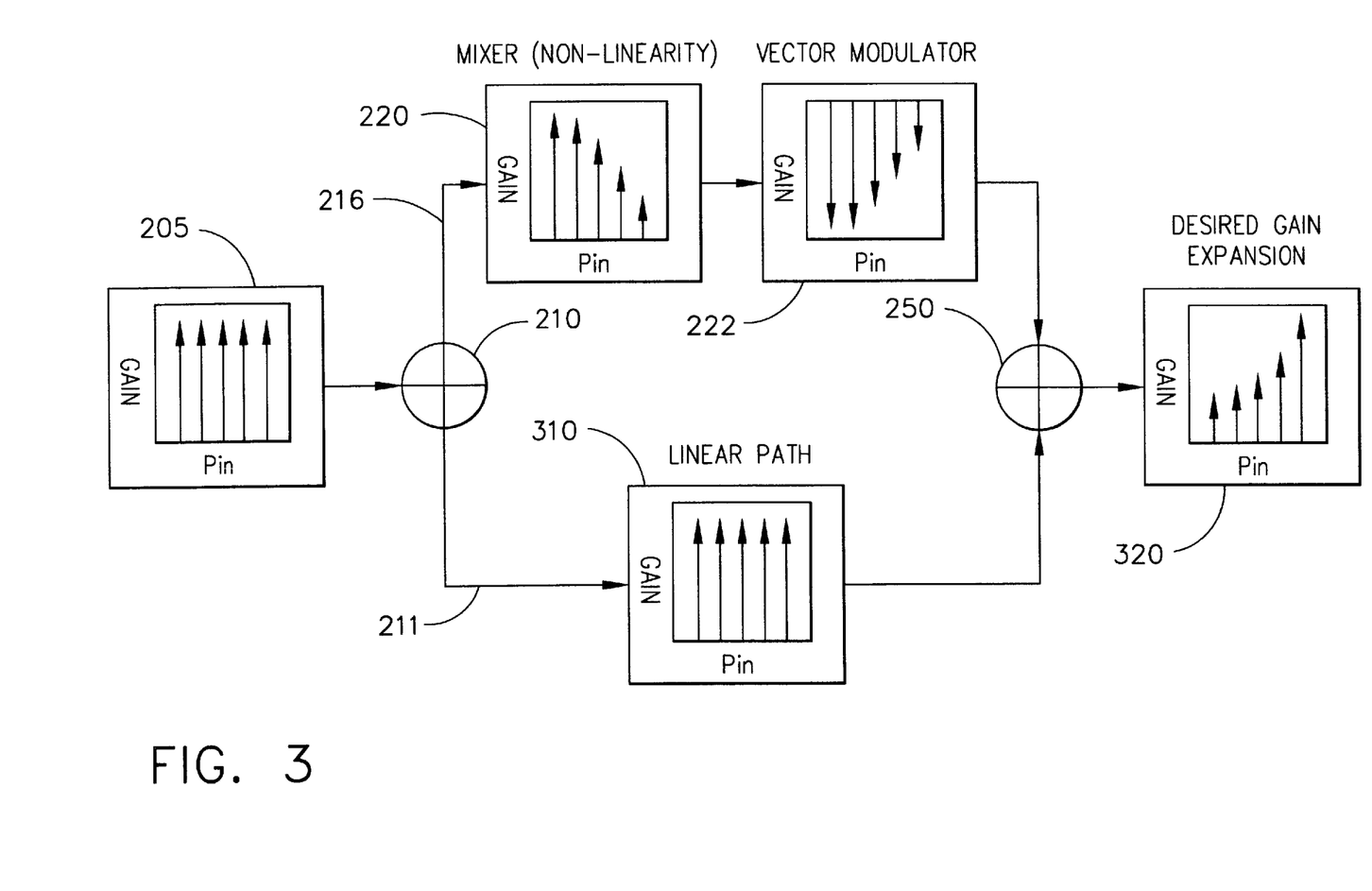
FIG. 3 is a schematic representation of a signal flow through the circuit of FIG. 2.

With reference to FIG. 3, operation of the system of the invention is further illustrated including operation of the mixer 220 and vector modulator 222. Input signal 205 may be divided by splitter 210 into first signal path 211 and second signal path 216. In the second signal path 216, a voltage level input from DAC 230 may control the saturation point and severity of signal compression of the mixer 220. Vector modulator 222 may be operable to shift the phase of an output of the mixer 220, as by 180 degrees as shown. In the first signal path 211, the signal 310 may be linear and may be attenuated and time delayed as well known in the art. The first and second signal paths 211 and 216 can be summed by summer 250 to yield a desired gain expansion signal 320. The desired gain expansion signal 320 preferably includes nonlinearities that extrapolate to provide linear performance up to saturation.

Processor chip 240 may be operable to include information regarding a plurality of power amplifiers. Such information may include amplifier parameters. By way of example and with reference to FIG. 4, a table 400 stored in processor chip 240 may include information regarding a plurality of TWTAs 410. Such information may include a digital word (not shown) representing a current value 420 and a digital word 430 representing a vector modulator setting corresponding to each TWTA 410. By way of example, a 6 bit word may be used to control the DAC 230 to output the appropriate current into the mixer 220 and thereby adjust the nonlinear gain characteristic of the mixer 220.

Figure 4:
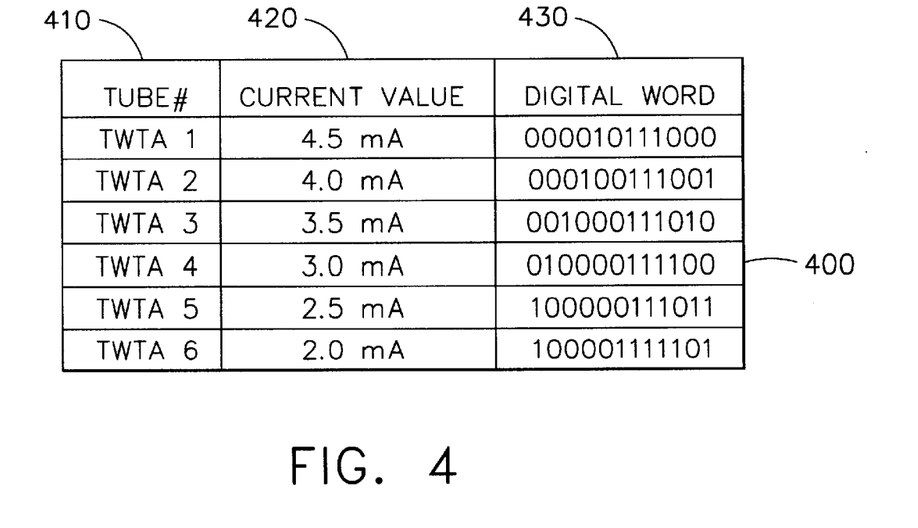
FIG. 4 is a tabular representation of information stored in a processor chip in accordance with the invention.
Figure 5:
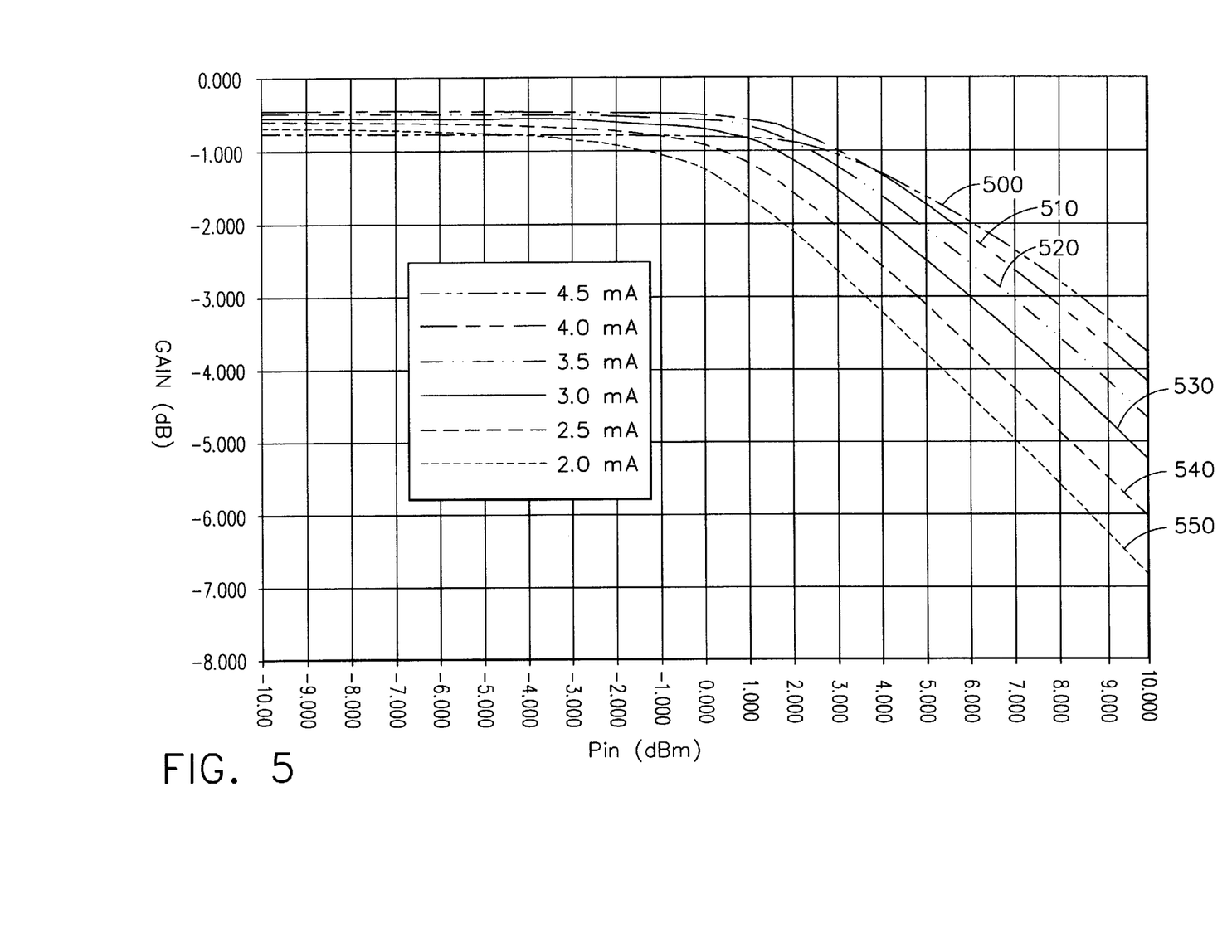
FIG. 5 is a graphical representation of mixer characteristics in accordance with the invention.

A 12 bit digital word 430 may be used to control the vector modulator 222. The vector modulator 222 may function as a complex multiplier such that the output of the vector modulator 222 is the input multiplied by a complex value, $\alpha+j\beta$. Of the 12 bit digital word 430 controlling the vector modulator 222, 6 bits may determine the value a in a range of −1 to 1 and 6 bits may determine the value of $\beta$ in a range of −1 to 1. Thus the vector modulator 222 is capable of applying a linear gain and phase shift to an input signal. The gain of the vector modulator 22 may be chosen to achieve the desired gain expansion for a chosen TWTA 410 and the phase of the vector modulator 222 may be chosen to achieve the desired phase expansion for the chosen TWTA 410. Thus by way of example, TWTA 1 can have an associated current value of 4.5 mA and an associated twelve bit digital word 430 of 000010111000. In operation, to linearize the operation of TWTA 1, processor chip 240 can provide the digital word representing a current value of 4.5 mA to DAC 230 which, in turn, provides 4.5 mA to mixer 220. Mixer 220 characteristics are shown in FIG. 5 including characteristic 500 for operation at 4.5 mA, characteristic 510 for operation at 4.0 mA, characteristic 520 for operation at 3.5 mA, characteristic 530 for operation at 3.0 mA, characteristic 540 for operation at 2.5 mA, and characteristic 550 for operation at 2.0 mA.

In accordance with another aspect of the invention, an amplifier system includes the digitally controllable nonlinear pre-equalizer circuit 200 described herein coupleable to a plurality of power amplifiers (not shown). Amplifier characteristics for each power amplifier may be stored in processor chip 240 which may be operable to provide such characteristics in the form of a digital signal to DAC 230. In turn, DAC 230 provides a current to mixer 220 to achieve a desired gain expansion signal 320 appropriate to each power amplifier.

In accordance with yet another aspect of the invention, a satellite system includes the digitally controllable nonlinear pre-equalizer circuit 200 described herein coupleable to a plurality of power amplifiers disposed in a satellite (not shown). As power amplifiers are replaced, the satellite system may be operable to provide predistortion particular to each power amplifier as described herein. In one embodiment, the amplifier characteristics may be sent from the processor chip 240 using an uplink command. In another embodiment, he processor chip 240 may be disposed on the satellite.

According to another aspect of the invention, a method for compensating for nonlinearities within a power amplifier includes the steps of dividing an input signal into a first signal path and a second signal path. The first signal path may be a linear path having some attenuation and time delay. The second signal path may be compressed and adjusted such that when the first signal path and second signal path are summed, a gain expansion signal is provided which extrapolates to provide linear performance up to saturation. The gain expansion signal may provide for both AM/AM and AM/PM compensation.

Figure 6:
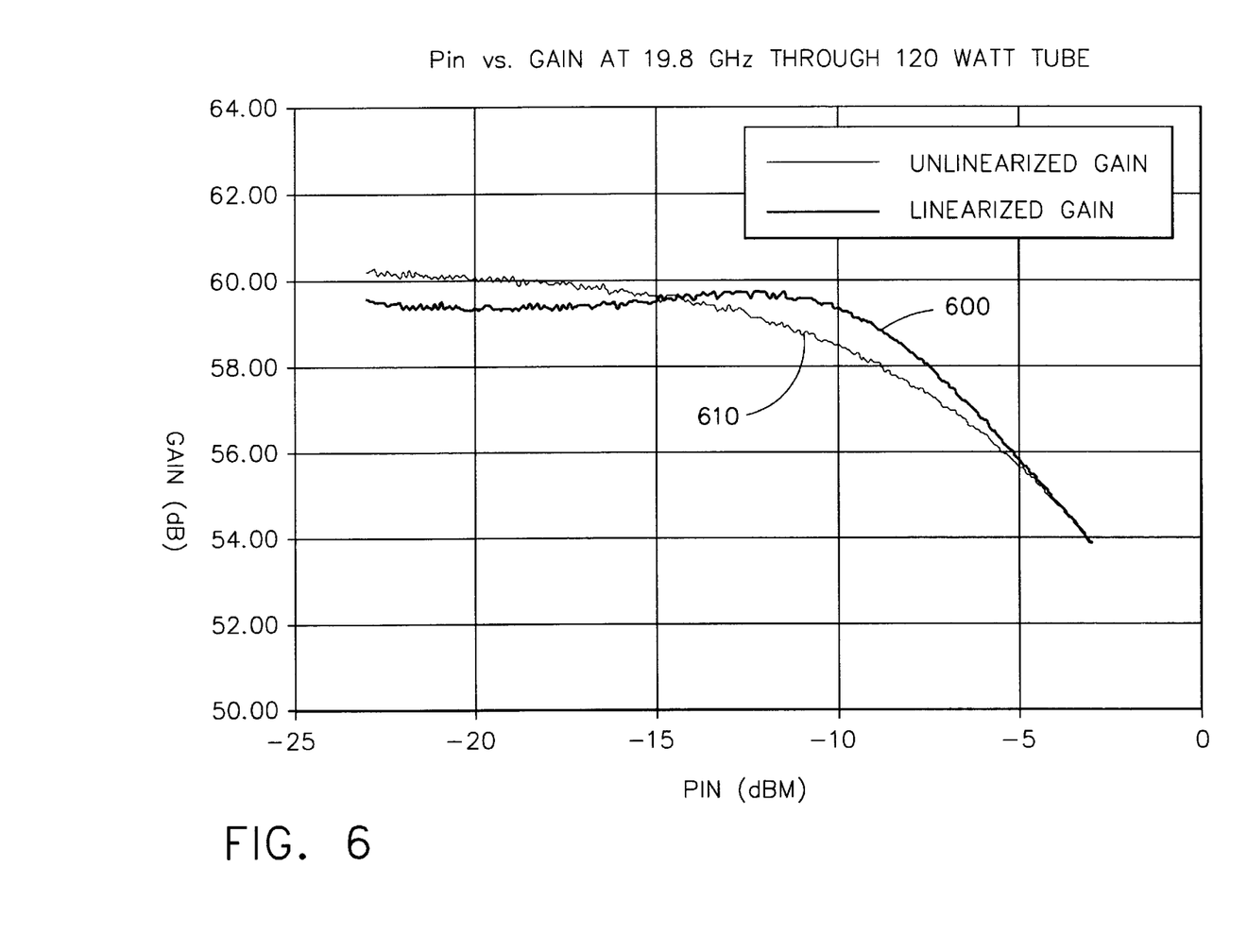
FIG. 6 is a graphical representation comparing linearized and unlinearized gain characteristics in accordance with the invention.
Figure 7:
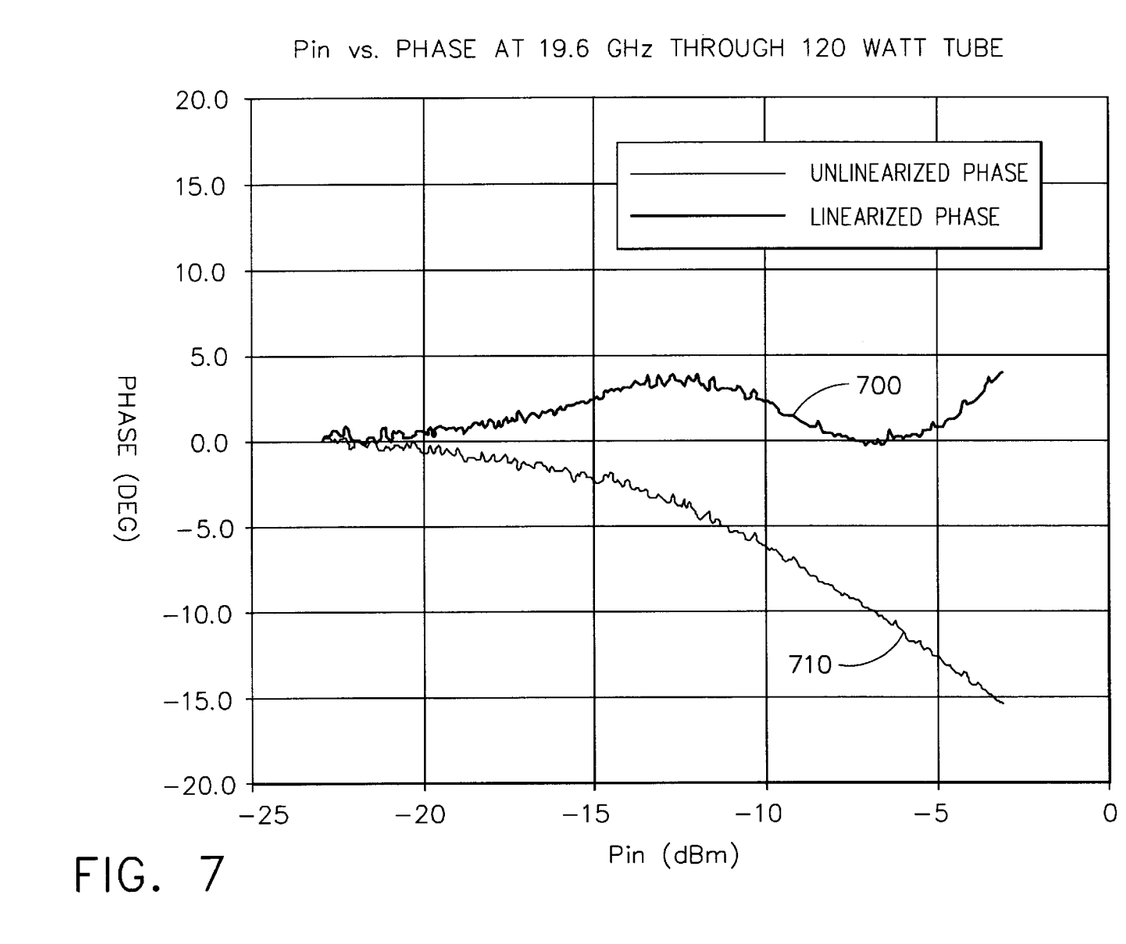
FIG. 7 is a graphical representation comparing linearized and unlinearized phase characteristics in accordance with the invention.

In accordance with the invention and with reference to FIG. 6, a linearized gain characteristic 600 for a 120 watt TWTA, as an example, produced by the system and method of the invention is shown to be substantially linear as compared to an unlinearized gain characteristic 610. In similar fashion and with reference to FIG. 7 a linearized phase characteristic 700 for a 120 watt TWTA produced by the system and method of the invention is shown to be substantially linear as compared to an unlinearized phase characteristic 710.

It should be understood, of course, that the foregoing relates to preferred embodiments of the invention and that modifications may be made without departing from the spirit and scope of the invention as set forth in the following claims.

We claim:

1. A digitally controllable nonlinear pre-equalizer circuit receiving an input signal and generating an output signal, the circuit comprising:

a splitter for dividing the input signal into a first signal path and a second signal path;

an attenuator and a time delay element in the first signal path, the attenuator and the time delay element operable to generate a linear signal;

a mixer and a vector modulator in the second signal path, the mixer being responsive to a signal from a digital to analog converter coupled to a processor chip providing a digital signal to the digital to analog converter, the mixer and vector modulator operable to generate a nonlinear signal; and a summer for summing thee linear signal and the nonlinear signal to generate the output signal.

2. The circuit of claim 1, wherein the processor chip is operable to store a plurality of power amplifier parameters corresponding to a plurality of power amplifiers, each power amplifier parameter being provideable as the digital signal to the digital to analog converter.

3. The circuit of claim 1, wherein the vector modulator is operable to adjust a phase and amplitude of the nonlinear signal.

4. The circuit of claim 1, wherein the output signal is a gain expansion signal having nonlinearities that extrapolate to provide linear performance of a power amplifier up to saturation.

5. A digitally controllable nonlinear pre-equalizer circuit receiving an input signal and generating an output signal, the circuit comprising:

a splitter for dividing the input signal into a first signal path and a second signal path;

an attenuator and a time delay element in the first signal path, the attenuator and the time delay element operable to generate a linear signal;

a mixer and a vector modulator in the second signal path, the mixer being responsive to a signal from a digital to analog converter coupled to a processor chip providing a digital signal to the digital to analog converter, the processor chip being operable to store a plurality of power amplifier parameters corresponding to a plurality of power amplifiers, each power amplifier parameter being provideable as the digital signal, the mixer and vector modulator operable to generate a nonlinear signal; and a summer for summing the linear signal and the nonlinear signal to generate the output signal.

6. The circuit of claim 5, wherein the vector modulator is operable to adjust a phase and amplitude of the nonlinear signal.

7. An amplifier system receiving an input signal and generating an output signal comprising:

a power amplifier;

a splitter for dividing the input signal into a first signal path and a second signal path;

an attenuator and a time delay element in the first signal path, the attenuator and the time delay element operable to generate a linear signal;

a mixer and a vector modulator in the second signal path, the mixer being responsive to a signal from a digital to analog converter coupled to a processor chip providing a digital signal to the digital to analog converter, the mixer and vector modulator operable to generate a nonlinear signal; and a summer for summing the linear signal and the nonlinear signal to generate a gain expansion signal, the gain expansion signal being input to the power amplifier, the power amplifier providing the output signal.

8. The amplifier system of claim 7, wherein the processor chip is operable to store a plurality of power amplifier parameters corresponding to a plurality of power amplifiers, each power amplifier parameter being provideable as the digital signal to the digital to analog converter.

9. The amplifier system of claim 7, wherein the vector modulator is operable to adjust a phase and amplitude of the nonlinear signal.

10. The amplifier system of claim 7, the gain expansion signal having nonlinearities that extrapolate to provide linear performance of a power amplifier up to saturation.

11. A satellite system receiving an input signal and generating an output signal comprising:
a satellite;
a power amplifier disposed on said satellite;
a nonlinear pre-equalizer circuit coupled to said power amplifier, said nonlinear pre-equalizer circuit including,
a splitter for dividing the input signal into a first signal path and a second signal path;
an attenuator and a time delay element in the first signal path, the attenuator and the time delay element operable to generate a linear signal;
a mixer and a vector modulator in the second signal path, the mixer being responsive to a signal from a digital to analog converter coupled to a processor chip providing a digital signal to the digital to analog converter,
a summer for summing the linear signal and the nonlinear signal to generate a gain expansion signal, the gain expansion signal being input to the power amplifier, the power amplifier providing the output signal.

12. The satellite system of claim 11, wherein the processor chip is operable to store a plurality of power amplifier parameters corresponding to a plurality of power amplifiers disposed on said satellite, each power amplifier parameter being provideable as the digital signal to the digital to analog converter.

13. The system of claim 11, wherein the vector modulator is operable to adjust a phase and amplitude of the nonlinear signal.

14. The system of claim 11, the gain expansion signal having nonlinearities that extrapolate to provide linear performance of a power amplifier up to saturation.

15. A method of digitally controlling a nonlinear pre-equalizer circuit receiving an input signal and generating an output signal, the method comprising:
dividing the input signal into a first signal path and a second signal path;
generating a linear signal by attenuating and time delaying the divided input signal in the first signal path;
generating a nonlinear signal by mixing and phase shifting the divided input signal in the second signal path, the mixing being responsive to a signal provided by a digital to analog converter coupled to a processor chip; and
summing the linear signal and the nonlinear signal to generate the output signal.

16. The method of claim 15, wherein the processor chip is operable to store a plurality of power amplifier parameters corresponding to a plurality of power amplifiers, each power amplifier parameter being provideable as the digital signal to the digital to analog converter.

17. The method of claim 15, wherein the vector modulator is operable to adjust a phase and amplitude of the nonlinear signal.

18. The method of claim 15, wherein the output signal is a gain expansion signal having nonlinearities that extrapolate to provide linear performance of a power amplifier up to saturation.

* * * * *